(12) United States Patent
Kuo et al.

(10) Patent No.: US 7,671,686 B2
(45) Date of Patent: Mar. 2, 2010

(54) LOW NOISE AMPLIFIER

(75) Inventors: Ming-Ching Kuo, Hsinchu (TW);
Shiau-Wen Kao, Hsinchu (TW);
Chih-Hung Chen, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 25 days.

(21) Appl. No.: 12/188,280

(22) Filed: Aug. 8, 2008

(65) Prior Publication Data

US 2009/0108943 A1 Apr. 30, 2009

Related U.S. Application Data

(60) Provisional application No. 60/960,988, filed on Oct. 24, 2007.

(51) Int. Cl.
*H03F 3/04* (2006.01)

(52) U.S. Cl. .................. 330/301; 330/253; 330/311
(58) Field of Classification Search .................. 330/253, 330/261, 301, 311

See application file for complete search history.

(56) References Cited

U.S. PATENT DOCUMENTS 6,417,737 B1 * 7/2002 Moloudi et al. ............. 330/301

* cited by examiner

*Primary Examiner*—Khanh V Nguyen
(74) *Attorney, Agent, or Firm*—Finnegan, Henderson, Farabow, Garrett & Dunner, LLP

(57) ABSTRACT

A low-noise amplifier circuit to convert a single-ended input into a dual-ended output includes an input transconductance stage circuit, including a first MOS transistor coupled in parallel with a second MOS transistor; a current buffer circuit, including a third MOS transistor coupled in parallel with a fourth MOS transistor; each of the first, second, third, and fourth transistors having a body, gate, source, and drain; the input transconductance stage circuit and the current buffer circuit being cascode coupled, forming a cascode amplifier configuration; the single-ended input being at the source of one of the first and second transistors in the input transconductance stage circuit; the dual-ended output being a differential output across the drain of the third transistor and the drain of the fourth transistor; the first and second transistors of the input transconductance stage circuit being cross-coupled, wherein the body of the first transistor is coupled to the source of the second transistor, and the body of the second transistor is coupled to the source of the first transistor; and the third and fourth transistors of the current buffer circuit being cross-coupled, wherein a first capacitance is coupled between the gate of the third transistor and the source of the fourth transistor, and a second capacitance is coupled between the gate of the fourth transistor and the source of the third transistor.

16 Claims, 10 Drawing Sheets

LOW NOISE AMPLIFIER

RELATED APPLICATIONS

This application claims priority of U.S. Provisional Patent Application No. 60/960,988 filed Oct. 24, 2007, the contents of which are incorporated herein by reference. This application is related to application Ser. No. 12/188,276.

FIELD OF THE INVENTION

Systems, circuits, and methods disclosed herein relate to amplifiers, circuits and, more particularly, to low-noise amplifier circuits.

DESCRIPTION OF THE RELATED ART

Spectrums designated by new standards for wireless communications are becoming increasingly broad. For example, ultra-wide band technology (UWB) utilizes the 3.1~10.6 GHz band range, where there is a triple highest/lowest band ratio; digital video broadcasting-handheld technology (DVB-H) utilizes the 474~862 MHz band range, where there is a nearly double highest/lowest band ratio; and Digital Video Broadcasting-Terrestrial (DVB-T) technology utilizes the 50~850 MHz band range, where there is a 17-fold highest/lowest band ratio.

Frameworks of traditional broadband low-noise amplifiers can be divided into several types, including (1) common-gate amplifiers, (2) shunt-feedback amplifiers, and (3) distributed amplifiers. These traditional broadband low-noise amplifiers generally have high noise levels as compared to inductive source degeneration low-noise amplifiers commonly used in narrowband systems.

Broadband communications present challenges for RF receiver design that are not presented by narrowband communications such as Global System for Mobile Communications (GSM) and Wideband Code Division Multiple Access (WBCDMA). For example, an increased potential for interference from an adjacent channel jammer raises the linearity requirement. Moreover, a receiver should ensure adequate quality of reception of each communication channel within the band. So, multimedia wireless communications may present harsher design requirements, including broadband gain flatness, higher linearity requirements, and lower noise figures.

A low-noise amplifier circuit may be placed at the first stage of an entire receiver. Thus, the circuit properties of low-noise amplifier circuits may directly impact the characteristics of the receiver as a whole.

SUMMARY OF THE INVENTION

In accordance with the present invention, there is provided a low-noise amplifier circuit to convert a single-ended input into a dual-ended output. The low-noise amplifier circuit includes an input transconductance stage circuit, including a first MOS transistor coupled in parallel with a second MOS transistor; a current buffer circuit, including a third MOS transistor coupled in parallel with a fourth MOS transistor; each of the first, second, third, and fourth transistors having a body, gate, source, and drain; the input transconductance stage circuit and the current buffer circuit being cascode coupled, forming a cascode amplifier configuration; the single-ended input being at the source of one of the first and second transistors in the input transconductance stage circuit; the dual-ended output being a differential output across the drain of the third transistor and the drain of the fourth transistor; the first and second transistors of the input transconductance stage circuit being cross-coupled, wherein the body of the first transistor is coupled to the source of the second transistor, and the body of the second transistor is coupled to the source of the first transistor; and the third and fourth transistors of the current buffer circuit being cross-coupled, wherein a first capacitance is coupled between the gate of the third transistor and the source of the fourth transistor, and a second capacitance is coupled between the gate of the fourth transistor and the source of the third transistor.

Also in accordance with the present invention, there is provided a low-noise amplifier circuit to convert a single-ended input into a dual-ended output. The low-noise amplifier circuit includes an input transconductance stage circuit including first and second MOS transistors; a current buffer circuit including third and fourth MOS transistors; the input transconductance stage circuit and the current buffer circuit being cascode coupled and forming a cascode amplifier configuration; the first and second MOS transistors in the input transconductance stage circuit being cross-coupled, wherein a body of the first transistor is coupled to a source of the second transistor, and a body of the second transistor is coupled to a source of the first transistor; the third and fourth MOS transistors in the current buffer circuit being cross-coupled, wherein a first capacitance is coupled between a gate of the third transistor and a source of the fourth transistor, and a second capacitance is coupled between a gate of the fourth transistor and a source of the third transistor; the single-ended input being at a source of one of the first and second transistors; the dual-ended output being a differential output across a drain of the third MOS transistor in the current buffer circuit and a drain of the fourth MOS transistor in the current buffer circuit.

Additional features and advantages of the invention will be set forth in the description that follows, being apparent from the description or learned by practice of embodiments of the invention. The features and other advantages of the invention will be realized and attained by the low-noise amplifier circuit designs pointed out in the written description and claims, as well as the appended drawings.

It is to be understood that both the foregoing general description and the following detailed description are exemplary and explanatory, and are intended to provide further explanation of the invention as claimed.

DESCRIPTION OF EMBODIMENTS

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments consistent with the present invention do not represent all implementations consistent with the invention. Instead, they are merely examples of systems and methods consistent with aspects related to the invention as recited in the appended claims.

Figure 1:
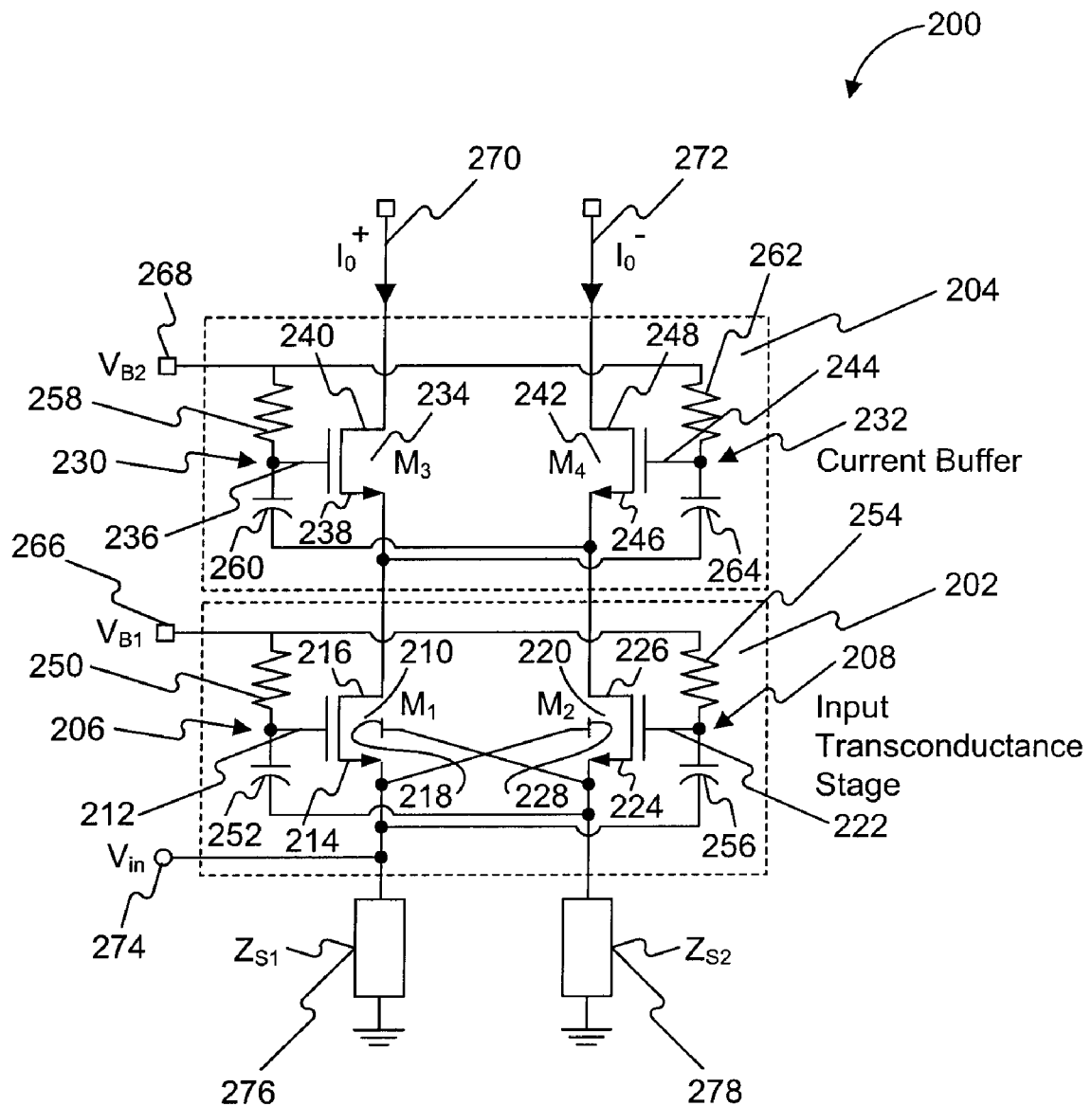
FIG. 1 shows a low-noise amplifier circuit consistent with embodiments of the invention.

FIG. 1 shows a low-noise amplifier circuit 200 consistent with embodiments of the invention. Low-noise amplifier circuit 200 includes an input transconductance stage circuit 202 and a current buffer stage circuit 204, with input transconductance stage circuit 202 being cascode coupled to current buffer stage circuit 204, forming a cascode amplifier configuration.

Input transconductance stage circuit 202 includes a common gate amplifier circuit 206 and a common source amplifier circuit 208. The parallel coupling of common source amplifier circuit 208 with common gate amplifier circuit 206 may substantially reduce or eliminate the noise contribution of common gate amplifier circuit 206 to low-noise amplifier 200 and, in an exemplary embodiment, boost the gain of low-noise amplifier circuit 200 by approximately 6 dB over a conventional common gate amplifier.

Amplifier circuit 206 includes an MOS transistor M1 210 including a gate 212, a source 214, and a drain 216. Transistor M1 210 also includes a substrate terminal 218. Amplifier circuit 208 includes an MOS transistor M2 220, including a gate 222, a source 224, and a drain 226. Transistor M2 220 also includes a substrate terminal 228.

Current buffer stage circuit 204 includes an amplifier circuit 230 and an amplifier circuit 232. Amplifier circuit 230 includes an MOS transistor M3 234 including a gate 236, a source 238, and drain 240. Amplifier circuit 232 includes an MOS transistor M4 242 including a gate 244, a source 246, and a drain 248.

Amplifier circuit 206 also includes a resistor 250 and a capacitor 252, respective first ends of which are coupled together and to gate 212 of MOS transistor M1 210. Amplifier circuit 208 further includes a resistor 254 and a capacitor 256 respective first ends of which are coupled together and to gate 222 of MOS transistor M2 220. Amplifier circuit 230 further includes a resistor 258 and a capacitor 260 respective first ends of which are coupled together and to gate 236 of MOS transistor M3 234. Amplifier circuit 232 further includes a resistor 262 and a capacitor 264 respective first ends of which are coupled together and to gate 244 of MOS transistor M4 242.

Common gate amplifier circuit 206 is cascode coupled to amplifier circuit 230 by coupling drain 216 of MOS transistor M1 210 to source 238 of MOS transistor M3 234. Common source amplifier circuit 208 is cascode coupled to amplifier circuit 232 by coupling drain 226 of MOS transistor M2 220 to source 246 of MOS transistor M4 242.

Low noise amplifier circuit 200 also includes bias voltage terminals 266 and 268 for respectively receiving bias voltages VB1 and VB2. These bias circuits VB1 and VB2 provide the gate bias required by the amplifier transistors. Bias voltage terminal 266 is coupled to respective second ends of resistors 250 and 254. Bias voltage terminal 268 is coupled to respective second ends of resistors 258 and 262.

Low noise amplifier circuit 200 further includes output terminals 270 and 272 respectively coupled to drains 240 and 248 of MOS transistors M3 234 and M4 242. Output terminal 270 comprises a first phase and output terminal 272 comprises a second phase, such that differential currents between output terminals 270 and 272 may have a linear positive ratio to an input voltage signal Vin.

Common gate amplifier circuit 206 and common source amplifier circuit 208 are cross-coupled. More particularly, substrate terminal 218 of MOS transistor M1 210 is coupled to source terminal 224 of MOS transistor M2 220, and substrate terminal 228 of MOS transistor M2 220 is coupled to source terminal 214 of MOS transistor M1 210.

Gate-source capacitive cross coupling is also shown in FIG. 1. In input transconductance stage 202, gate 212 of MOS transistor M1 210 is coupled to source 224 of MOS transistor M2 220 through capacitor 252. Further, gate 222 of MOS transistor M2 220 is coupled to source 214 of MOS transistor M1 210 through capacitor 256. In current buffer stage circuit 204, gate 236 of MOS transistor M3 234 is coupled to source 246 of MOS transistor M4 242 through capacitor 260. Further, gate 244 of MOS transistor M4 242 is coupled to source 238 of MOS transistor M3 234 through capacitor 264. Gate-source capacitive cross coupling can help neutralize the noise due to the contribution of common source amplifier circuit 208 and improve the linearity of the low-noise amplifier 200 through releasing the second-order interaction with improved even-order harmonic rejection. Improved differential balance output may also be achieved due to an enhanced common-mode rejection ratio (CMRR).

An input terminal 274 is coupled to source 214 of MOS transistor M1 210 for receiving an input voltage Vin. Source 214 of MOS transistor M1 210 is coupled through a high impedance element 276, such as an inductor, to ground, to provide broadband impedance matching characteristics. High impedance element 276 can be either an on-chip or off-chip element.

Common gate amplifier circuit 206 can provide broadband impedance matching, while common source amplifier circuit 208 can provide noise elimination functions. Parallel coupling of common source amplifier circuit 208 with common gate amplifier circuit 206 can substantially reduce a thermal noise contribution of common gate amplifier circuit 206 to low-noise amplifier circuit 200 and, in an exemplary embodiment, can boost the gain of a low-noise amplifier circuit 200 by approximately 6 dB over a conventional common gate amplifier.

As a result of the substrate dual cross-coupling between transistors M1 210 and M2 220 of input transconductance stage 202, MOS transistors M1 210 and M2 220 may each separately have a 20% enhancement of an equivalent transconductance parameter, $g'_m$, as shown in equations (1) and (2).

$$g'_m = g_m + g_{mb} \quad (1)$$

$$g_{mb} \approx \frac{g_m}{5} \quad (2)$$

In equations (1) and (2), for each of MOS transistors M1 210 and M2 220, $g_m$ is the transistor's transconductance and $g_{mb}$ is the transistor's body transconductance. As shown in equation (1), this enhancement in $g'_m$ is due to the addition of the body transconductance $g_{mb}$ to the MOS transconductance $g_m$. An enhancement in the equivalent transconductance parameter $g'_m$ may provide a higher gain and a lower noise level. The benefits of this dual cross-coupling will be explained in further detail below with reference to FIGS. 4 and 5.

Loads 276 and 278 coupled between low-noise amplifier circuit 200 and ground may take on a wide variety of forms, as explained next. More particularly, examples of loads that may be used in conjunction with the low-noise amplifier circuit 200 are shown in FIGS. 2A-2C and 3A-3D. However, loads used in conjunction with low-noise amplifier circuit 200 are not limited to those presented as examples. It is possible to use other appropriate loads, including different combinations of the loads shown as examples.

Each of FIGS. 2A-2C and 3A-3D also illustrate that output terminals 270 and 272 may additionally be coupled to power supply terminals 280 and 282, respectively. Further, a load 284 may be coupled between output terminal 270 and power supply terminal 280, and a load 286 may be coupled between output terminal 272 and power supply terminal 282. Each of FIGS. 2A-2C and 3A-3D additionally show provision of output voltages Vo+ and Vo− on output terminals 270 and 272, respectively.

Figure 2A:
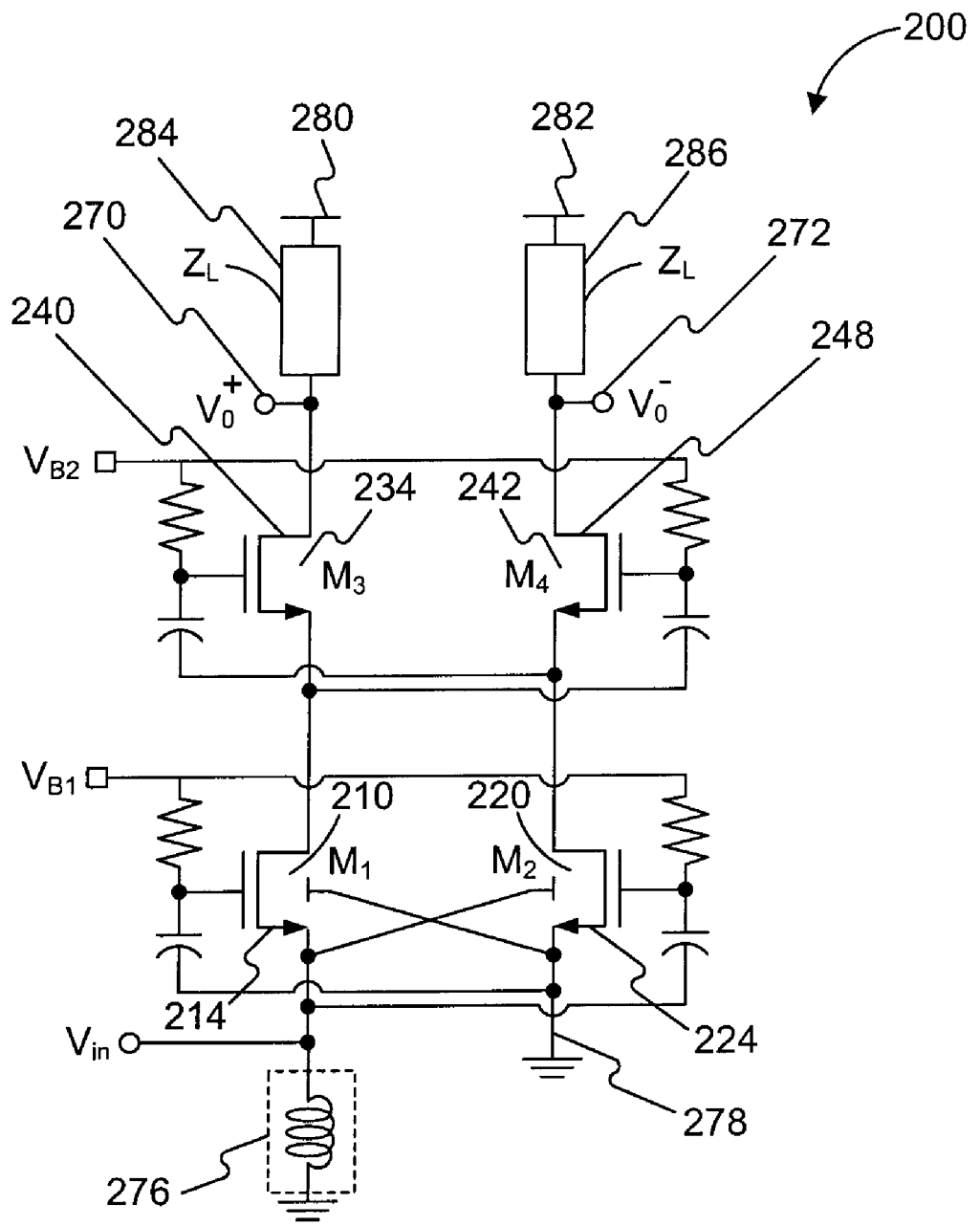
FIG. 2A shows a low-noise amplifier circuit consistent with embodiments of the invention.

FIG. 2A shows an exemplary embodiment of low-noise amplifier circuit 200, that includes load 276 coupled between low-noise amplifier circuit 200 and ground, and loads 284 and 286 coupled between output terminals 270 and 272 and power supply terminals 280 and 282, respectively. Source 214 of MOS transistor M1 210 is coupled through load 276, provided as an inductance, to ground. Source 224 of MOS transistor M2 220 is coupled directly to ground. Drain 240 of MOS transistor M3 234 is coupled through load 284 to power supply terminal 280. Drain 248 of MOS transistor M4 242 is coupled through load 286 to power supply terminal 282.

Figure 2B:
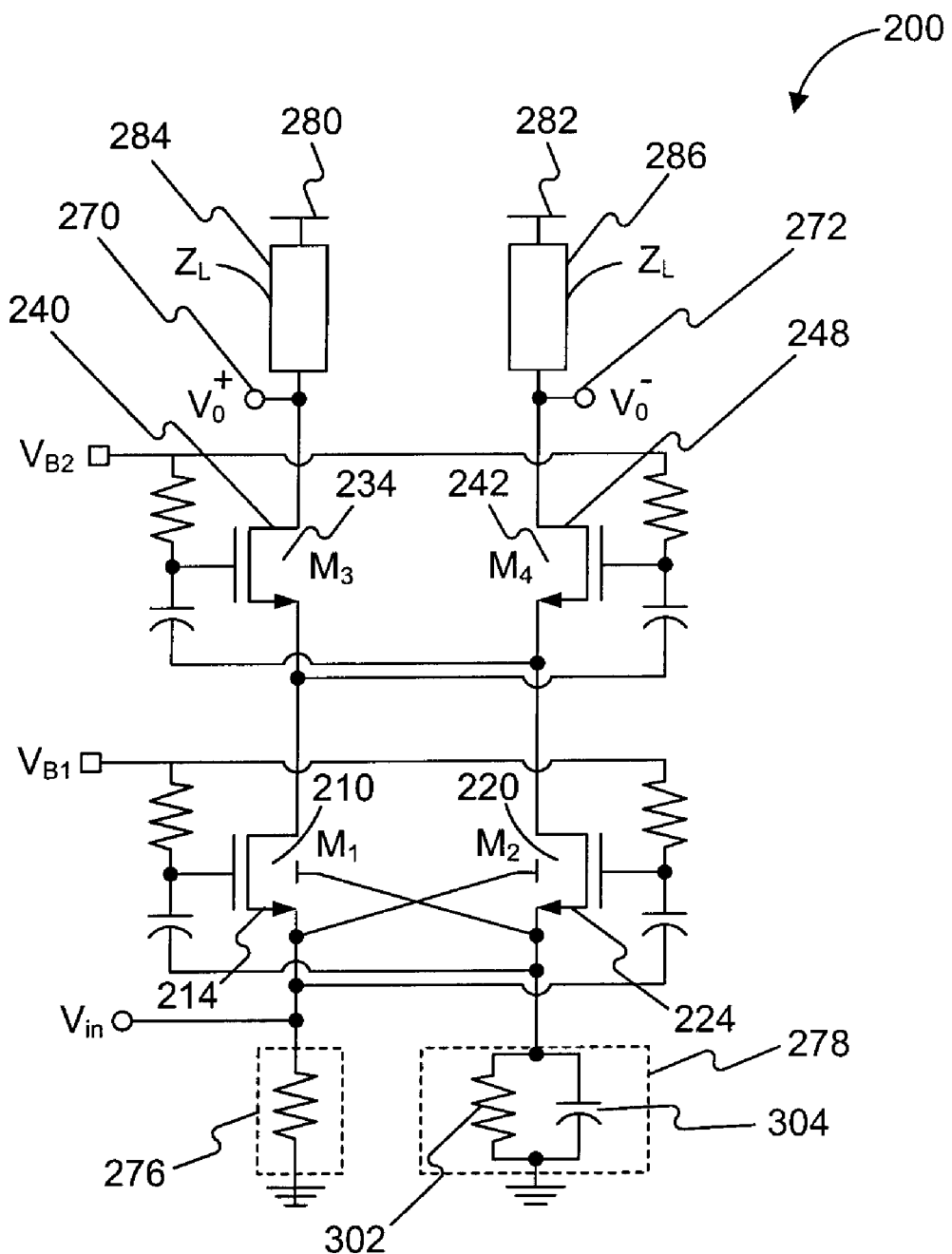
FIG. 2B shows a low-noise amplifier circuit consistent with embodiments of the invention.

FIG. 2B shows another exemplary embodiment of low-noise amplifier circuit 200, that includes loads 276 and 278 coupled between low-noise amplifier circuit 200 and ground, and loads 284 and 286 coupled between output terminals 270 and 272 and power supply terminals 280 and 282, respectively. Source 214 of MOS transistor M1 210 is coupled through load 276, provided as a resistance, to ground. Source 224 of MOS transistor M2 220 is coupled through load 278, provided as a resistance 302 and a capacitance 304 coupled in parallel, to ground. Drain 240 of MOS transistor M3 234 is coupled through load 284 to power supply terminal 280. Drain 248 of MOS transistor M4 242 is coupled through load 286 to power supply terminal 282.

Figure 2C:
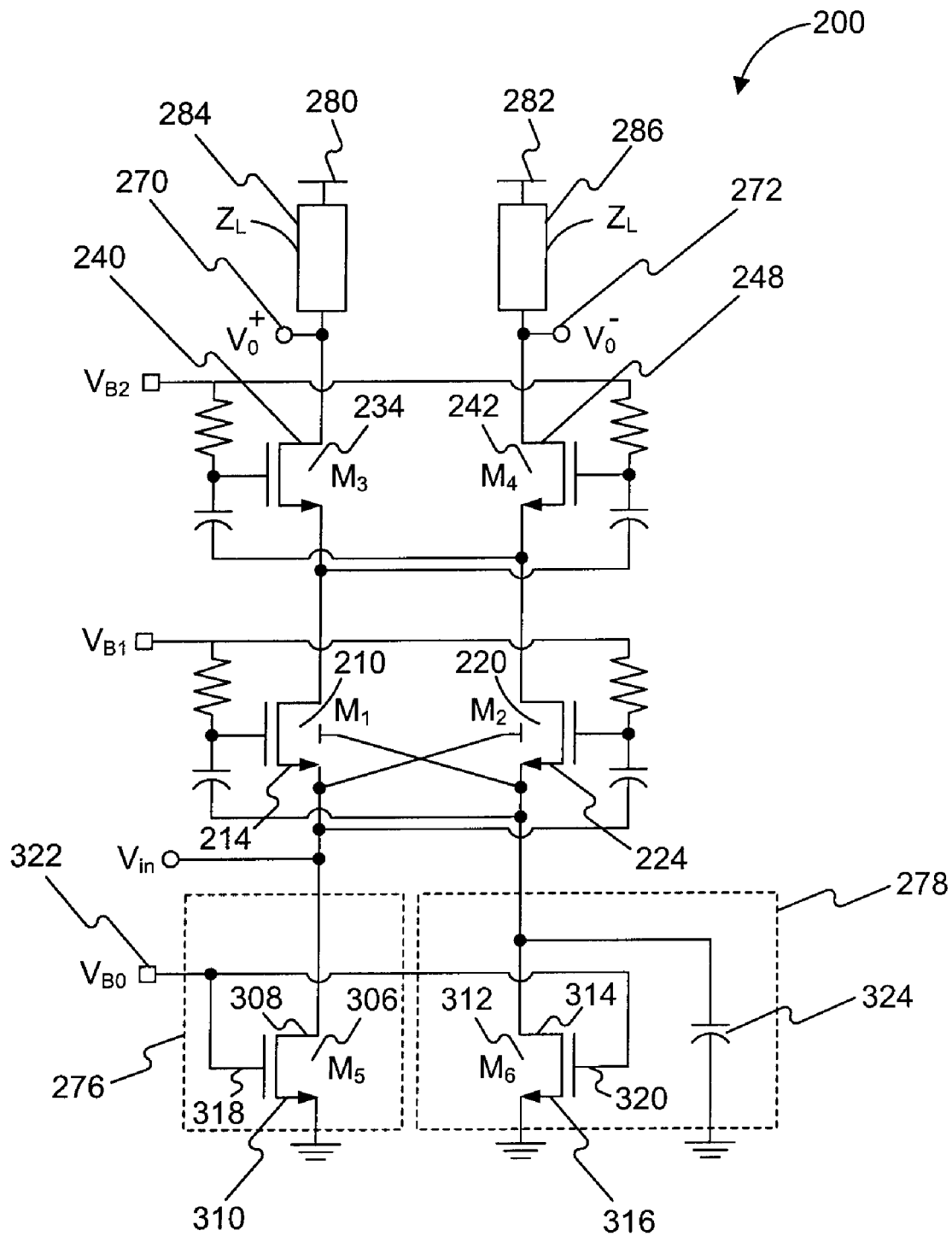
FIG. 2C shows a low-noise amplifier circuit consistent with embodiments of the invention.

FIG. 2C shows another exemplary embodiment of low-noise amplifier circuit 200, that includes loads 276 and 278 coupled between low-noise amplifier circuit 200 and ground, and loads 284 and 286 coupled between output terminals 270 and 272 and power supply terminals 280 and 282, respectively. Source 214 of MOS transistor M1 210 is coupled through load 276, provided as an MOS transistor M5 306, to ground. More specifically, source 214 of MOS transistor M1 210 is coupled to a drain 308 of MOS transistor M5 306, and a source 310 of MOS transistor M5 306 is coupled to ground. Source 224 of MOS transistor M2 220 is coupled through load 278, provided as an MOS transistor M6 312, to ground. More specifically, source 224 of MOS transistor M2 220 is coupled to a drain 314 of MOS transistor M6 312, and a source 316 of MOS transistor M6 312 is coupled to ground. Further, gates 318 and 320 of MOS transistors M5 306 and M6 312, respectively, are coupled to a bias voltage terminal 322 for receiving a bias voltage VB0. Further, drain 314 of MOS transistor M6 312 and source 224 of MOS transistor M2 220 are coupled through a capacitance 324 to ground. Drain 240 of MOS transistor M3 234 is coupled through load 284 to power supply terminal 280. Drain 248 of MOS transistor M4 242 is coupled through load 286 to power supply terminal 282.

Figure 3A:
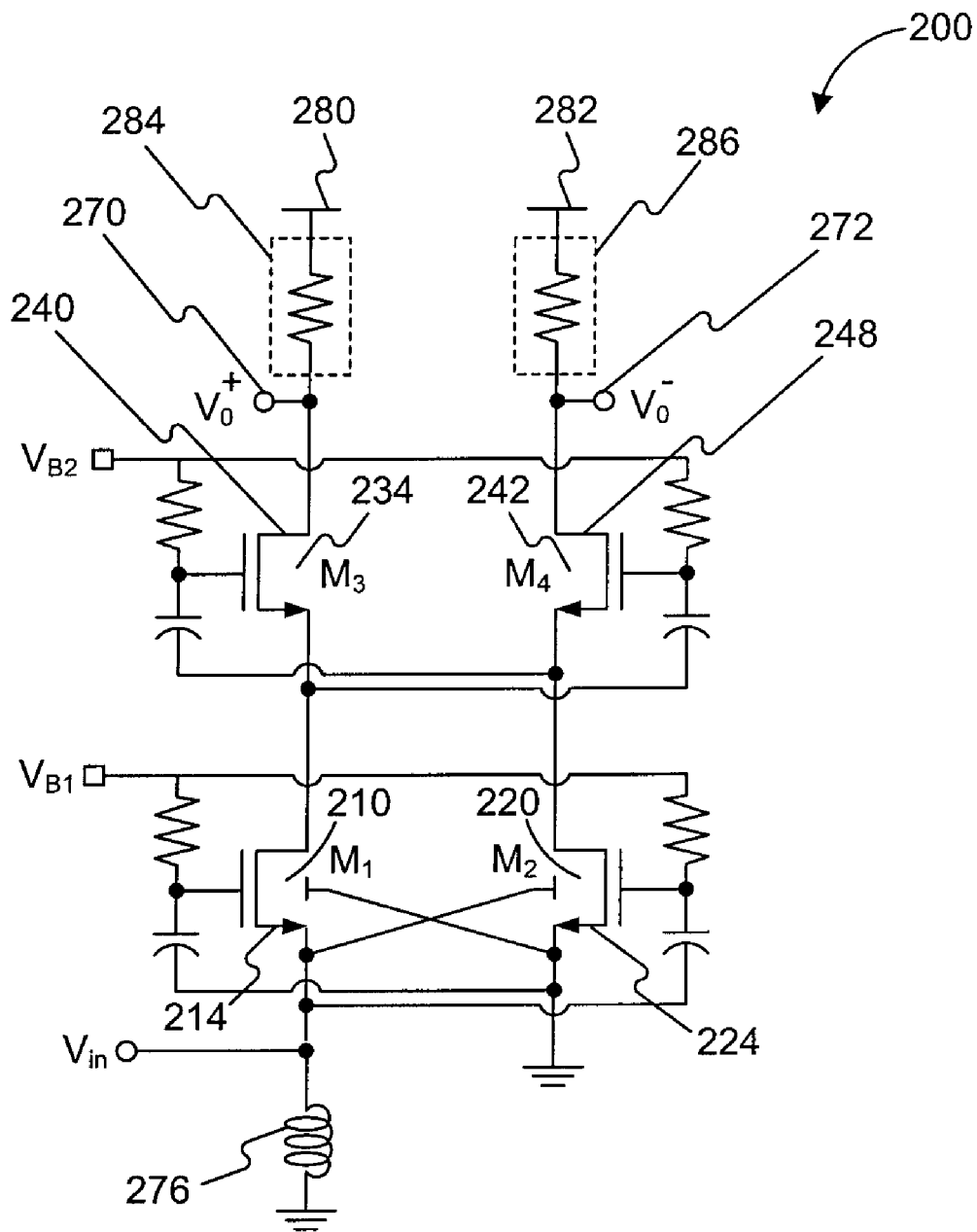
FIG. 3A shows a low-noise amplifier circuit consistent with embodiments of the invention.

FIG. 3A shows another exemplary embodiment of low-noise amplifier circuit 200, that includes load 276 coupled between low-noise amplifier circuit 200 and ground, and loads 284 and 286 coupled between output terminals 270 and 272 and power supply terminals 280 and 282, respectively. Source 214 of MOS transistor M1 210 is coupled through load 276, provided as an inductance, to ground. Source 224 of MOS transistor M2 220 is coupled directly to ground. Drain 240 of MOS transistor M3 234 is coupled through load 284, provided as a resistance, to power supply terminal 280. Drain 248 of MOS transistor M4 242 is coupled through load 286, provided as a resistance, to power supply terminal 282.

Figure 3B:
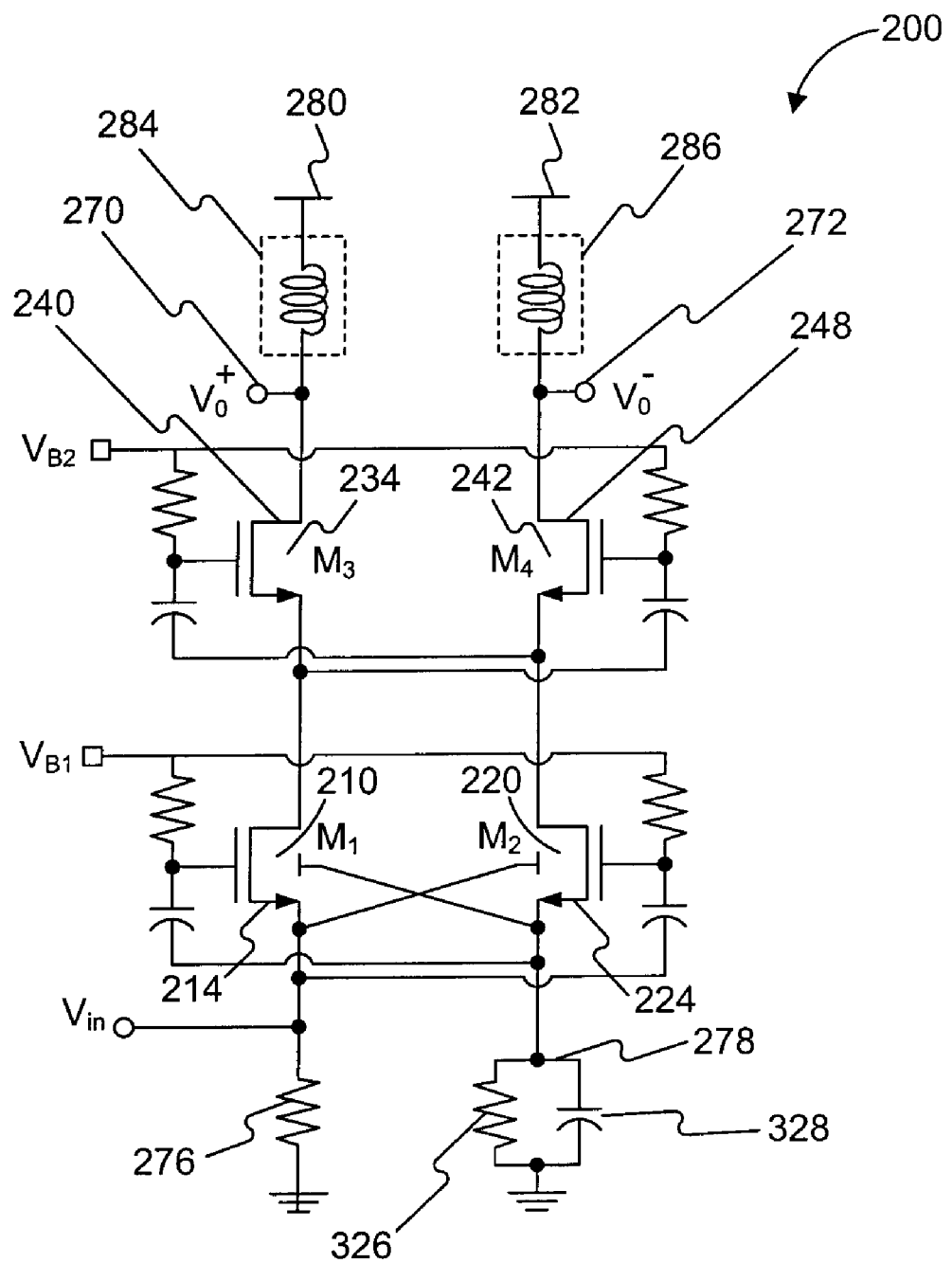
FIG. 3B shows a low-noise amplifier circuit consistent with embodiments of the invention.

FIG. 3B shows another exemplary embodiment of low-noise amplifier circuit 200, that includes loads 276 and 278 coupled between low-noise amplifier circuit 200 and ground, and loads 284 and 286 coupled between output terminals 270 and 272 and power supply terminals 280 and 282, respectively. Source 214 of MOS transistor M1 210 is coupled through load 276, provided as a resistance, to ground. Source 224 of MOS transistor M2 220 is coupled through load 278, provided as a resistance 326 and a capacitance 328 coupled in parallel, to ground. Drain 240 of MOS transistor M3 234 is coupled through load 284, provided as an inductance, to power supply terminal 280. Drain 248 of MOS transistor M4 242 is coupled through load 286, provided as an inductance, to power supply terminal 282.

Figure 3C:
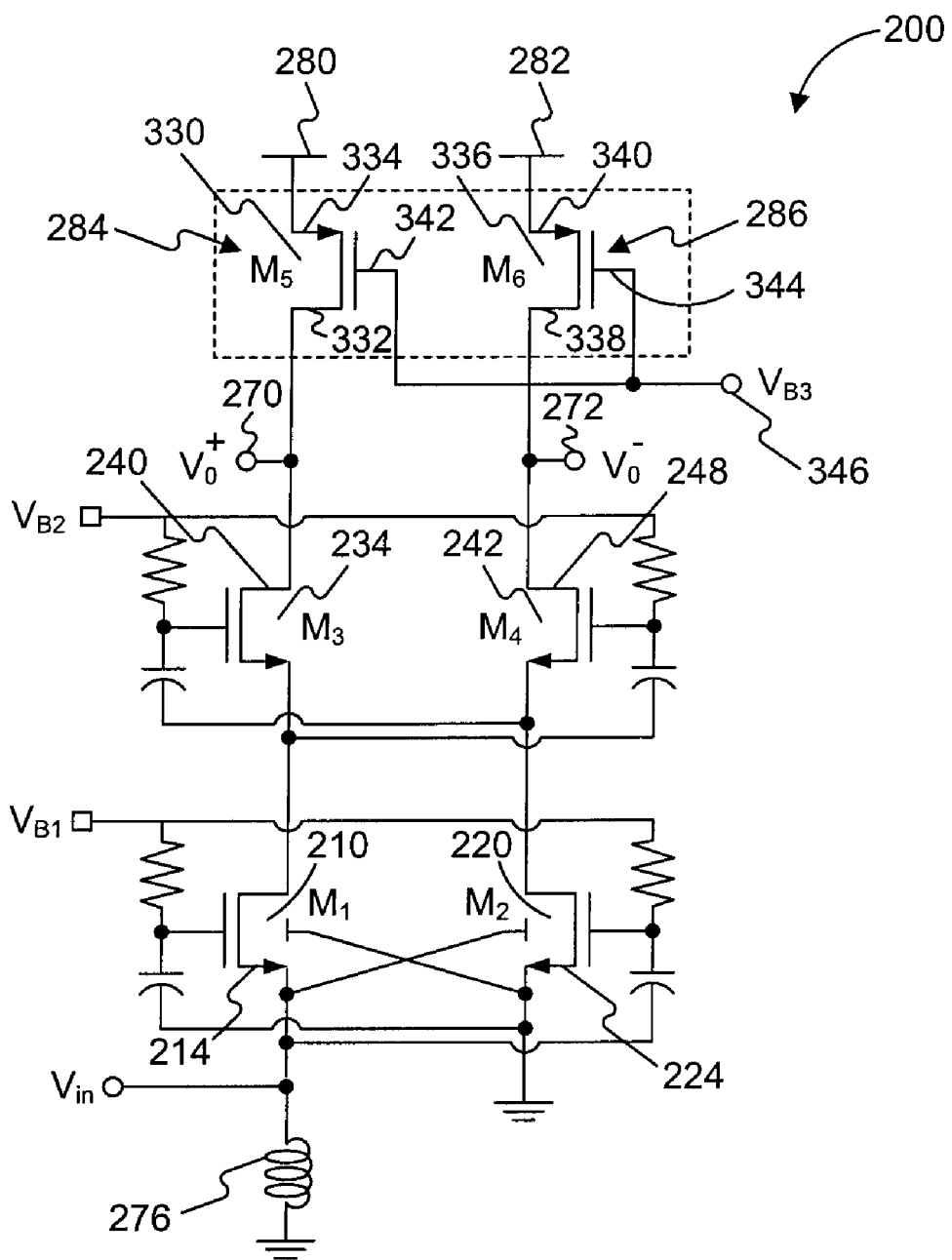
FIG. 3C shows a low-noise amplifier circuit consistent with embodiments of the invention.

FIG. 3C shows another exemplary embodiment of low-noise amplifier circuit 200, that includes load 276 coupled between low-noise amplifier circuit 200 and ground, and loads 284 and 286 coupled between output terminals 270 and 272 and power supply terminals 280 and 282, respectively. Source 214 of MOS transistor M1 210 is coupled through load 276, provided as an inductance, to ground. Source 224 of MOS transistor M2 220 is coupled directly to ground. Drain 240 of MOS transistor M3 234 is coupled through load 284, provided as an MOS transistor M5 330, to power terminal 280. More specifically, drain 240 of MOS transistor M3 234 is coupled to a drain 332 of MOS transistor M5 330, and a source 334 of MOS transistor M5 330 is coupled to power terminal 280. Drain 248 of MOS transistor M4 242 is coupled through load 286, provided as an MOS transistor M6 336, to power terminal 282. More specifically, drain 248 of MOS transistor M4 242 is coupled to a drain 338 of MOS transistor M6 336, and a source 340 of MOS transistor M6 336 is coupled to power terminal 282. Further, gates 342 and 344 of MOS transistors M5 330 and M6 336, respectively, are coupled to a bias voltage terminal 346 for receiving a bias voltage VB3.

Figure 3D:
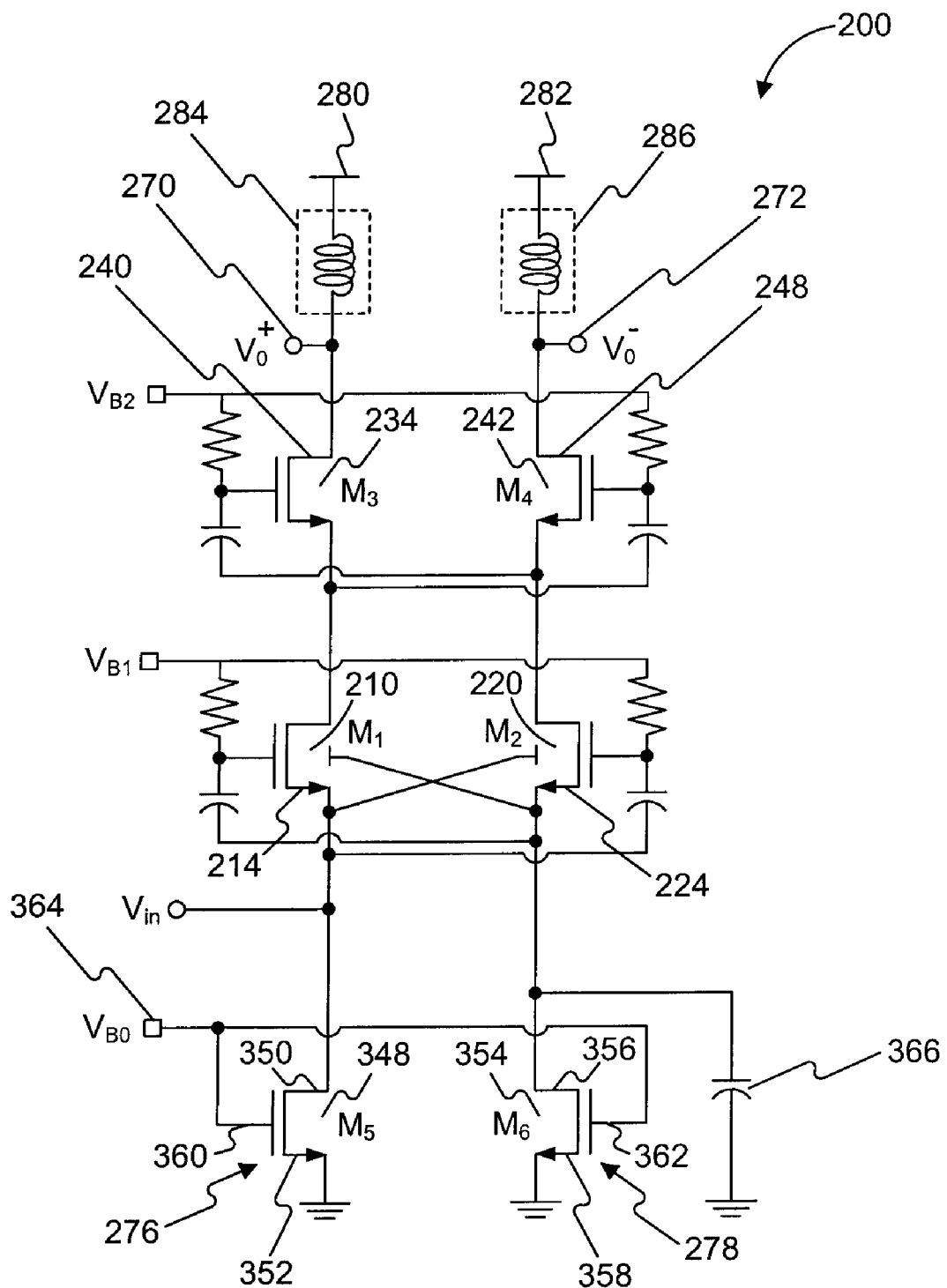
FIG. 3D shows a low-noise amplifier circuit consistent with embodiments of the invention.

FIG. 3D shows another exemplary embodiment of low-noise amplifier circuit 200, that includes loads 276 and 278 coupled between low-noise amplifier circuit 200 and ground, and loads 284 and 286 coupled between output terminals 270 and 272 and power supply terminals 280 and 282, respectively. Source 214 of MOS transistor M1 210 is coupled through load 276, provided as an MOS transistor M5 348, to ground. More specifically, source 214 of MOS transistor M1 210 is coupled to a drain 350 of MOS transistor M5 348, and a source 352 of MOS transistor M5 348 is coupled to ground. Source 224 of MOS transistor M2 220 is coupled through load 278, provided as an MOS transistor M6 354, to ground. More specifically, source 224 of MOS transistor M2 220 is coupled to a drain 356 of MOS transistor M6 354, and a source 358 of MOS transistor M6 354 is coupled to ground. Further, gates 360 and 362 of MOS transistors M5 348 and M6 354, respectively, are coupled to a bias voltage terminal 364 for receiving a bias voltage VB0. Further, drain 356 of MOS transistor M6 354 and source 224 of MOS transistor M2 220 are coupled through a capacitance 366 to ground. Drain 240 of MOS transistor M3 234 is coupled through load 284, provided as an inductance, to power supply terminal 280. Drain 248 of MOS transistor M4 242 is coupled through load 286, provided as an inductance, to power supply terminal 282.

Figure 4A:
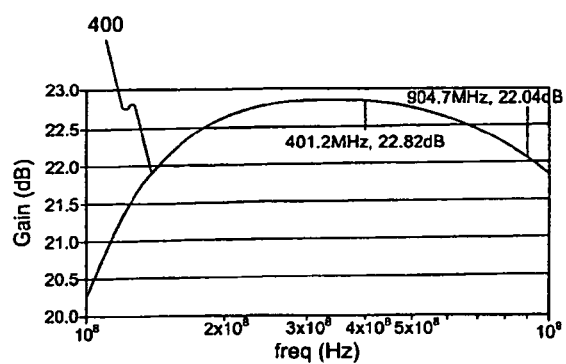
FIG. 4A shows a plot of voltage gain vs. input voltage frequency for a low-noise amplifier circuit configured as shown in FIG. 3A, utilizing dual cross-coupling technique.
Figure 4B:
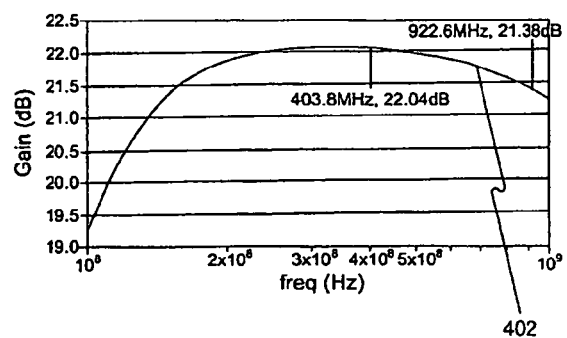
FIG. 4B shows a plot of voltage gain vs. input voltage frequency for a low-noise amplifier circuit configured as shown in FIG. 3A, without utilizing dual cross-coupling.

FIG. 4A shows a computed plot of voltage gain vs. input voltage frequency for low-noise amplifier circuit 200 configured as shown in FIG. 3A, utilizing dual cross-coupling. FIG. 4B shows a plot of voltage gain vs. input voltage frequency for a low-noise amplifier configured as shown in FIG. 3A, but without utilizing dual cross-coupling. FIG. 4A illustrates a voltage conversion curve 400 that would result from operation of low-noise amplifier circuit 200 configured as shown in FIG. 3A, utilizing dual cross-coupling. FIG. 4B illustrates a voltage conversion curve 402 that would result from operation of the low-noise amplifier circuit configured as shown in FIG. 3A, but without utilizing dual cross-coupling. FIGS. 4A and 4B are based on circuit simulations performed on Sep. 18, 2007.

Figure 5A:
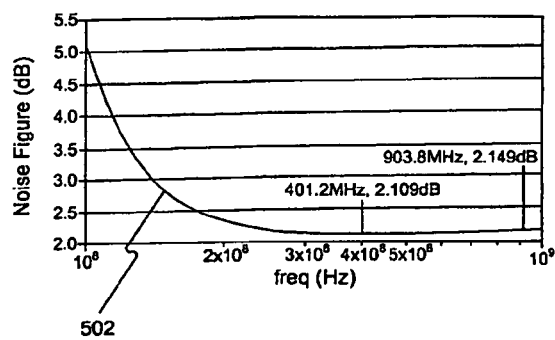
FIG. 5A shows a plot of noise figure vs. input signal frequency for a low noise-amplifier circuit configured as shown in FIG. 3A, utilizing dual cross-coupling.
Figure 5B:
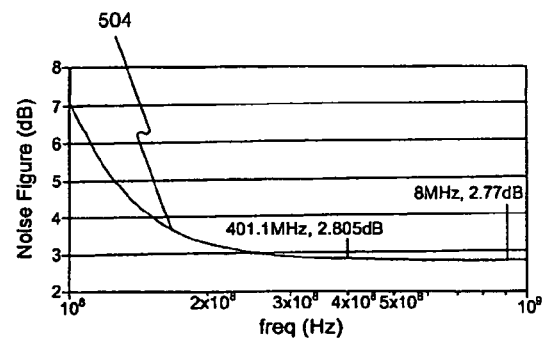
FIG. 5B shows a plot of noise figure vs. input signal frequency for a low noise-amplifier circuit configured as shown in FIG. 3A, without utilizing dual cross-coupling.

Voltage conversion curves 400 and 402 illustrate the improvement in band voltage conversion gain that can be realized by a low-noise amplifier circuit utilizing dual cross-coupling. It can be seen by comparing voltage conversion curves 400 and 402 that the voltage conversion gain of low-noise amplifier circuit 200 utilizing dual cross-coupling can be increased by more than 0.8 dB compared to the voltage conversion gain of the low-noise amplifier circuit that does not utilize dual cross-coupling. More particularly, at an input voltage frequency of approximately 400 MHz, voltage conversion curve 400 resulting from low-noise amplifier circuit 200 utilizing dual cross-coupling shows a gain of 22.82 dB, whereas voltage conversion curve 402 resulting from the low-noise amplifier circuit without dual cross-coupling shows a gain of 22.04 dB. Further, at a voltage input frequency of approximately 900 MHz, voltage conversion curve 400 resulting from low-noise amplifier circuit 200 utilizing dual cross-coupling shows a gain of 22.04 dB, whereas voltage conversion curve 402 resulting from the low-noise amplifier circuit without dual cross-coupling shows a gain of 21.38 dB FIG. 5A shows a computed plot of noise figure vs. input signal frequency for low-noise amplifier circuit 200 configured as shown in FIG. 3A, utilizing dual cross-coupling. FIG. 5B shows a computed plot of noise figure vs. input signal frequency for a low-noise amplifier configured as shown in FIG. 3A, but without utilizing dual cross-coupling. FIG. 5A illustrates a noise response curve 502 that would result from operation of low-noise amplifier circuit 200 configured as shown in FIG. 3A, utilizing dual cross-coupling. FIG. 5B illustrates a noise response curve 504 that would result from operation of the low-noise amplifier circuit configured as shown in FIG. 3A, but without utilizing dual cross-coupling. FIGS. 5A and 5B are based on circuit simulations performed on Sep. 18, 2007.

Noise response curves 502 and 504 illustrate the improvement in noise response that can be realized by a low-noise amplifier circuit utilizing dual cross-coupling. It can be seen by comparing noise response curves 502 and 504 that the noise figure, a measure of degradation in signal-to-noise ratio caused by a circuit, of low-noise amplifier circuit 200 that utilizes dual cross-coupling can be effectively improved by more than 0.6 dB compared to the noise figure of the low-noise amplifier circuit that does not utilize dual cross-coupling. More particularly, at an input signal frequency of approximately 400 MHz, noise response curve 502 resulting from low-noise amplifier circuit 200 utilizing dual cross-coupling shows a gain of 2.109 dB, whereas noise response curve 504 resulting from the low-noise amplifier circuit without dual cross-coupling shows a gain of 2.805 dB. Further, at an input signal frequency of approximately 900 MHz, noise response curve 502 resulting from low-noise amplifier circuit 200 utilizing dual cross-coupling shows a gain of 2.149 dB, whereas noise response curve 504 resulting from the low-noise amplifier circuit without dual cross-coupling shows a gain of 2.77 dB.

It will be apparent to those skilled in the art that various modifications and variations can be made in the disclosed structures and methods without departing from the scope or spirit of the invention. Other embodiments of the invention will be apparent to those skilled in the art from consideration of the specification and practice of the invention disclosed herein. It is intended that the specification and examples be considered exemplary only, with a true scope and spirit of the invention being indicated by the following claims.

The invention claimed is:

1. A low-noise amplifier circuit to convert a single-ended input into a dual-ended output, comprising:
    an input transconductance stage circuit, including a first MOS transistor coupled in parallel with a second MOS transistor;
    a current buffer circuit, including a third MOS transistor coupled in parallel with a fourth MOS transistor;
    each of the first, second, third, and fourth transistors having a body, gate, source, and drain;
    the input transconductance stage circuit and the current buffer circuit being cascode coupled, forming a cascode amplifier configuration;
    the single-ended input being at the source of one of the first and second transistors in the input transconductance stage circuit;
    the dual-ended output being a differential output across the drain of the third transistor and the drain of the fourth transistor;
    the first and second transistors of the input transconductance stage circuit being cross-coupled, wherein the body of the first transistor is coupled to the source of the second transistor, and the body of the second transistor is coupled to the source of the first transistor; and
    the third and fourth transistors of the current buffer circuit being cross-coupled, wherein a first capacitance is coupled between the gate of the third transistor and the source of the fourth transistor, and a second capacitance is coupled between the gate of the fourth transistor and the source of the third transistor.

2. The low-noise amplifier circuit of claim 1, further comprising:

a first resistance coupled between the gate of the first transistor and a terminal for receiving a first bias voltage;

a second resistance coupled between the gate of the second transistor and a terminal for receiving the first bias voltage;

a third resistance coupled between the gate of the third transistor and a terminal for receiving a second bias voltage;

a fourth resistance coupled between the gate of the fourth transistor and a terminal for receiving the second bias voltage;

a first impedance circuit coupled between the drain of the third transistor and a power source terminal; and a second impedance circuit coupled between the drain of the fourth transistor and the power source terminal.

3. The low-noise amplifier circuit of claim 2 further comprising a third impedance circuit coupled between the source of the first transistor and a ground terminal.

4. The low-noise amplifier circuit of claim 2 further comprising a third impedance circuit coupled between the source of the second transistor and a ground terminal.

5. The low-noise amplifier circuit of claim 2 further comprising a third impedance circuit coupled between the source of the first transistor and a ground terminal, and a fourth impedance circuit coupled between the source of the second transistor and the ground terminal.

6. The low-noise amplifier circuit of claim 1 further comprising a third capacitance coupled between the gate of the first transistor and the source of the second transistor, and a fourth capacitance coupled between the gate of the second transistor and the source of the first transistor.

7. The low-noise amplifier circuit of claim 5, wherein one or more of the first, second, third, and fourth impedance circuits comprises an inductance.

8. The low-noise amplifier circuit of claim 5, wherein one or more of the first, second, third, and fourth impedance circuits comprises a resistance.

9. The low-noise amplifier circuit of claim 5, wherein one or more of the first, second, third, and fourth impedance circuits comprises a resistance and a capacitance coupled in parallel.

10. The low-noise amplifier circuit of claim 5, wherein one or more of the first, second, third, and fourth impedance circuits comprises a transistor.

11. The low-noise amplifier circuit of claim 5, wherein one or more of the first, second, third, and fourth impedance circuits comprises any combination of a resistance, a capacitance, an inductance, and a transistor.

12. A low-noise amplifier circuit to convert a single-ended input into a dual-ended output, comprising:

an input transconductance stage circuit including first and second MOS transistors;

a current buffer circuit including third and fourth MOS transistors;

the input transconductance stage circuit and the current buffer circuit being cascode coupled and forming a cascode amplifier configuration;

the first and second MOS transistors in the input transconductance stage circuit being cross-coupled, wherein a body of the first transistor is coupled to a source of the second transistor, and a body of the second transistor is coupled to a source of the first transistor;

the third and fourth MOS transistors in the current buffer circuit being cross-coupled, wherein a first capacitance is coupled between a gate of the third transistor and a source of the fourth transistor, and a second capacitance is coupled between a gate of the fourth transistor and a source of the third transistor;

the single-ended input being at the source of one of the first and second transistors;

the dual-ended output being a differential output across a drain of the third MOS transistor in the current buffer circuit and a drain of the fourth MOS transistor in the current buffer circuit.

13. The low-noise amplifier circuit of claim 12 further comprising a first impedance circuit coupled between the source of the first transistor and a ground terminal, a second impedance circuit coupled between the source of the second transistor and the ground terminal, a third impedance circuit coupled between the drain of the third transistor and a power source terminal, and a fourth impedance circuit coupled between the drain of the fourth transistor and the power source terminal.

14. The low-noise amplifier circuit of claim 12 further comprising a third capacitance coupled between a gate of the first MOS transistor and the source of the second MOS transistor, and a fourth capacitance coupled between a gate of the second MOS transistor and the source of the first MOS transistor.

15. The low-noise amplifier circuit of claim 13 further comprising a third capacitance coupled between a gate of the first transistor and the source of the second transistor, and a fourth capacitance coupled between a gate of the second transistor and the source of the first transistor.

16. The low-noise amplifier circuit of claim 13, wherein one or more of the first, second, third, and fourth impedance circuits comprises any combination of a resistance, a capacitance, an inductance, and a transistor.

* * * * *